(12) United States Patent
Masuda

(10) Patent No.: US 9,647,106 B2
(45) Date of Patent: May 9, 2017

(54) SILICON CARBIDE SEMICONDUCTOR DEVICE AND METHOD FOR MANUFACTURING SAME

(71) Applicant: Sumitomo Electric Industries, Ltd., Osaka-shi (JP)

(72) Inventor: Takeyoshi Masuda, Osaka (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 0 days.

(21) Appl. No.: 14/598,996

(22) Filed: Jan. 16, 2015

(65) Prior Publication Data
US 2015/0236148 A1   Aug. 20, 2015

(30) Foreign Application Priority Data

Feb. 20, 2014 (JP) ................. 2014-030621

(51) Int. Cl.
| | |
|---|---|
| *H01L 29/15* | (2006.01) |
| *H01L 29/78* | (2006.01) |
| *H01L 29/16* | (2006.01) |
| *H01L 29/66* | (2006.01) |
| *H01L 29/49* | (2006.01) |
| *H01L 29/423* | (2006.01) |
| *H01L 29/04* | (2006.01) |

(Continued)

(52) U.S. Cl.
CPC .... *H01L 29/7813* (2013.01); *H01L 21/02236* (2013.01); *H01L 21/02247* (2013.01); *H01L 21/02255* (2013.01); *H01L 21/3065* (2013.01); *H01L 29/045* (2013.01); *H01L 29/1608* (2013.01); *H01L 29/4236* (2013.01); *H01L 29/495* (2013.01); *H01L 29/4916* (2013.01); *H01L 29/4975* (2013.01); *H01L 29/66734* (2013.01)

(58) Field of Classification Search
CPC .......... H01L 29/7813; H01L 21/02236; H01L 21/02247; H01L 21/02255
USPC .......................................................... 257/77
See application file for complete search history.

(56) References Cited

U.S. PATENT DOCUMENTS

| | | | | |
|---|---|---|---|---|
| 5,877,528 A | * | 3/1999 | So ................. | H01L 27/088 257/331 |
| 6,096,607 A | * | 8/2000 | Ueno ............... | H01L 21/0475 257/E21.605 |

(Continued)

FOREIGN PATENT DOCUMENTS

JP  2012-074720 A  4/2012

*Primary Examiner* — Ori Nadav
(74) *Attorney, Agent, or Firm* — Venable LLP; Michael A. Sartori; F. Brock Riggs

(57) ABSTRACT

A silicon carbide semiconductor device includes a silicon carbide substrate, a gate insulating film, a gate electrode, an interlayer insulating film, and a gate interconnection. The silicon carbide substrate includes: a first impurity region; a second impurity region provided on the first impurity region; and a third impurity region provided on the second impurity region so as to be separated from the first impurity region. A trench has a side portion and a bottom portion, the side portion extending to the first impurity region through the third impurity region and the second impurity region, the bottom portion being located in the first impurity region. When viewed in across section, the interlayer insulating film extends from above the third impurity region to above the gate electrode so as to cover the corner portion.

11 Claims, 14 Drawing Sheets

(51) Int. Cl.
*H01L 21/02* (2006.01)
*H01L 21/3065* (2006.01)

(56) References Cited

U.S. PATENT DOCUMENTS

| | | | | | |
|---|---|---|---|---|---|
| 6,297,100 | B1* | 10/2001 | Kumar | ................ | H01L 21/0445 257/E21.054 |
| 8,198,678 | B2* | 6/2012 | Mauder | ................ | H01L 29/407 257/341 |
| 8,889,511 | B2* | 11/2014 | Yedinak | ............. | H01L 21/3065 257/340 |
| 2006/0209586 | A1* | 9/2006 | Hirler | ................ | H01L 29/4236 365/149 |
| 2011/0233562 | A1* | 9/2011 | Harada | ................ | H01L 29/808 257/77 |
| 2011/0297963 | A1* | 12/2011 | Honaga | ................ | H01L 21/049 257/77 |
| 2012/0127278 | A1* | 5/2012 | Liu | ........................ | G03B 35/08 348/49 |
| 2012/0228640 | A1* | 9/2012 | Masuda | ................ | H01L 29/045 257/77 |
| 2012/0319134 | A1* | 12/2012 | Honaga | ............... | H01L 29/4941 257/77 |
| 2012/0326166 | A1* | 12/2012 | Masuda | ................ | H01L 21/049 257/77 |

* cited by examiner

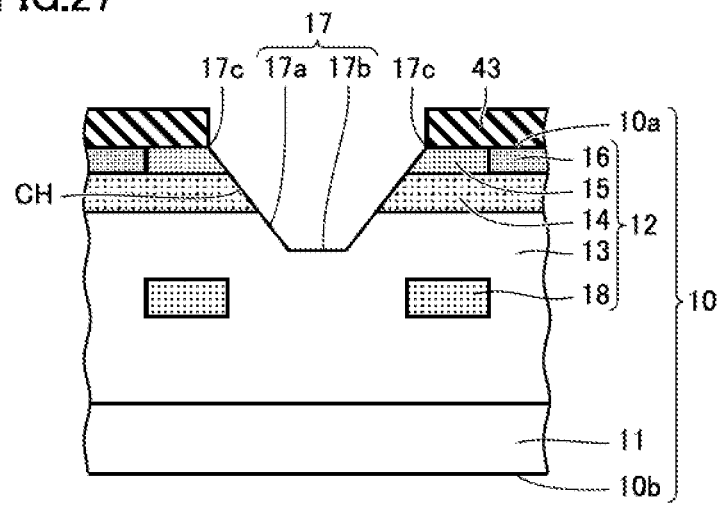
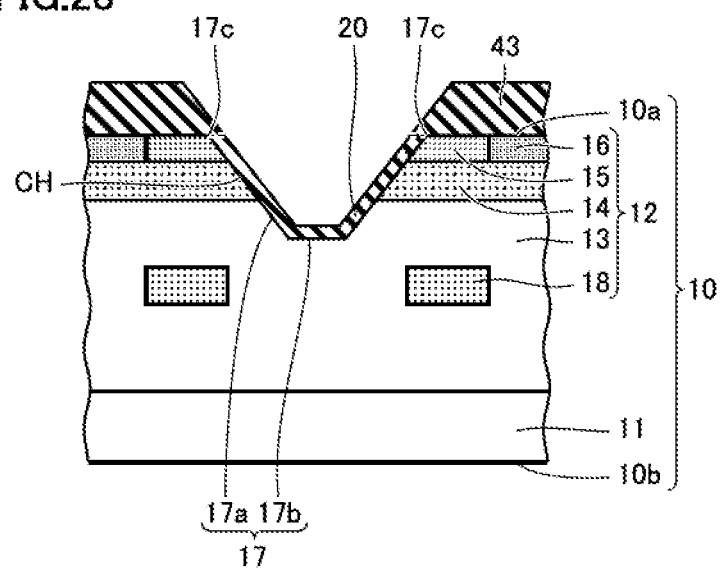

SILICON CARBIDE SEMICONDUCTOR DEVICE AND METHOD FOR MANUFACTURING SAME

BACKGROUND OF THE INVENTION

Field of the Invention

The present invention relates to a silicon carbide semiconductor device and a method for manufacturing the silicon carbide semiconductor device, in particular, a silicon carbide semiconductor device provided with a trench and a method for manufacturing such a silicon carbide semiconductor device.

Description of the Background Art

In recent years, in order to achieve high breakdown voltage, low loss, and utilization of semiconductor devices, such as a MOSFET (Metal Oxide Semiconductor Field Effect Transistor, under a high temperature environment, silicon carbide has begun to be adopted as a material for a semiconductor device. Silicon carbide is a wide band gap semiconductor having a band gap larger than that of silicon, which has been conventionally widely used as a material for semiconductor devices. Hence, by adopting silicon carbide as a material for a semiconductor device, the semiconductor device can have a high breakdown voltage, reduced on-resistance, and the like. Further, the semiconductor device thus adopting silicon carbide as its material has characteristics less deteriorated even under a high temperature environment than those of a semiconductor device adopting silicon as its material, advantageously.

In a MOSFET including a substrate having a main surface in which a trench is formed, an electric field is concentrated at a corner portion formed by a side portion, which forms the trench, and the main surface of the substrate with the result that a gate insulating film formed in the vicinity of the corner portion may be broken. For example, Japanese Patent Laying-Open No. 2012-74720 describes a silicon MOSFET in which: a gate electrode is provided in a trench formed in a main surface of a substrate and a field insulating film is formed on the main surface of the substrate and a corner portion formed by a side portion of the trench and the main surface of the substrate.

SUMMARY OF THE INVENTION

However, a thermal oxidation film of silicon carbide includes more carbon than a thermal oxidation film of silicon. Therefore, the thermal oxidation film of silicon carbide has a dielectric breakdown strength weaker than the thermal oxidation film of silicon. Accordingly, when MOSFETs respectively including a silicon carbide substrate and a silicon substrate both provided with trench structures having the same shape are formed and the same voltage (for example, 20 V) is applied to their gate electrodes, leakage of gate current is more likely to take place in the MOSFET made of silicon carbide as compared with the MOSFET made of silicon.

Moreover, in order to form a thick thermal oxidation film by thermally oxidizing the silicon carbide substrate, higher temperature and longer time are required than those in thermally oxidizing the silicon substrate. Thus, it is more difficult to form a thick thermal oxidation film by thermally oxidizing the silicon carbide substrate, as compared with a case of forming a thick thermal oxidation film on the silicon substrate.

Furthermore, ion implantation is employed to form an impurity region in the silicon carbide substrate. Therefore, after the ion implantation, the silicon carbide substrate needs to be subjected to an activation annealing process at a high temperature of about 1800° C. If a thermal oxidation film is formed on the silicon carbide substrate, the thermal oxidation film will be sublimated in the activation annealing process. Therefore, in the case of forming a field oxide film on the silicon carbide substrate, the field oxide film needs to be formed by a deposition method after forming the impurity region. That is, since the structure and manufacturing method for the field oxide film used for the silicon substrate are actually inapplicable to the silicon carbide substrate, it is difficult to improve dielectric breakdown resistance in the silicon carbide semiconductor device.

The present invention has been made to solve the foregoing problem, and has an object to provide a silicon carbide semiconductor device capable of improving dielectric breakdown resistance as well as a method for manufacturing such a silicon carbide semiconductor device.

A silicon carbide semiconductor device according to the present invention includes a silicon carbide substrate, a gate insulating film, a gate electrode, an interlayer insulating film, and a gate interconnection. The silicon carbide substrate has a main surface. The silicon carbide substrate includes: a first impurity region that has a first conductivity type; a second impurity region that is provided on the first impurity region and that has a second conductivity type different from the first conductivity type; and a third impurity region that is provided on the second impurity region so as to be separated from the first impurity region, that forms the main surface, and that has the first conductivity type. The main surface of the silicon carbide substrate is provided with a trench. The trench has a side portion and a bottom portion, the side portion extending to the first impurity region through the third impurity region and the second impurity region, the bottom portion being located in the first impurity region. The gate insulating film is in contact with a corner portion formed by the side portion and the main surface, the bottom portion, and the side portion. The gate electrode is in contact with the gate insulating film within the trench. In the interlayer insulating film, an opening is formed to expose a portion of the gate electrode. The gate interconnection is disposed in the opening and in contact with the gate electrode. When viewed in a cross section, the interlayer insulating film extends from above the third impurity region to above the gate electrode so as to cover the corner portion.

A method for manufacturing the silicon carbide semiconductor device according to the present invention includes the following steps. There is prepared a silicon carbide substrate having a main surface. The silicon carbide substrate includes: a first impurity region that has a first conductivity type; a second impurity region that is provided on the first impurity region and that has a second conductivity type different from the first conductivity type; and a third impurity region that is provided on the second impurity region so as to be separated from the first impurity region, that forms the main surface, and that has the first conductivity type. The main surface of the silicon carbide substrate is provided with a trench. The trench has a side portion and a bottom portion, the side portion extending to the first impurity region through the third impurity region and the second impurity region, the bottom portion being located in the first impurity region. A gate insulating film is formed in contact with a corner portion formed by the side portion and the main surface, the bottom portion, and the side portion. A gate electrode is formed in contact with the gate insulating film within the trench. An interlayer insulating film is formed in which an opening is formed to expose a portion of the gate electrode. A gate interconnection is formed to be disposed in the opening and in contact with the gate electrode. When viewed in a cross section, the interlayer insulating film extends from above the third impurity region to above the gate electrode so as to cover the corner portion.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 27 is a partial schematic cross sectional view schematically showing a first step of a modification of the method for manufacturing the silicon carbide semiconductor device according to the embodiment of the present invention.

FIG. 28 is a partial schematic cross sectional view schematically showing a second step of the modification of the method for manufacturing the silicon carbide semiconductor device according to the embodiment of the present invention.

DESCRIPTION OF THE PREFERRED EMBODIMENTS

Figure 1:
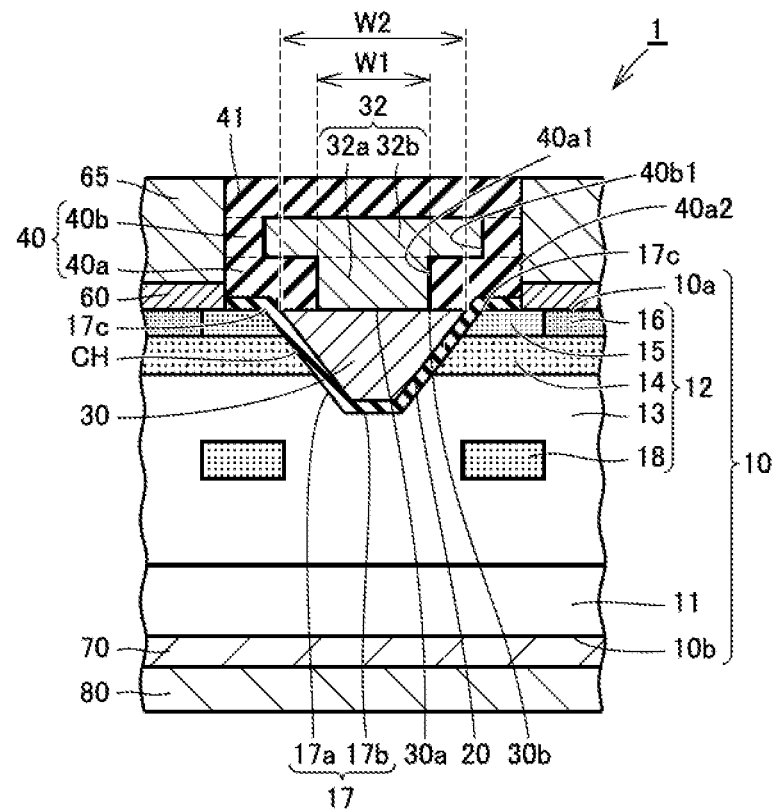
FIG. 1 is a schematic cross sectional view schematically showing a configuration of a silicon carbide semiconductor device according to one embodiment of the present invention, and is a partial schematic cross sectional view in a region I-I of FIG. 3.

[Description of Embodiments of the Invention of the Present Application]

The following describes embodiments of the present invention with reference to figures. It should be noted that in the below-mentioned figures, the same or corresponding portions are given the same reference characters and are not described repeatedly. Regarding crystallographic indications in the present specification, an individual orientation is represented by [ ], a group orientation is represented by < >, and an individual plane is represented by ( ), and a group plane is represented by { }. In addition, a negative crystallographic index is normally expressed by putting "-" (bar) above a numeral, but is expressed by putting the negative sign before the numeral in the present specification.

(1) A silicon carbide semiconductor device 1 according to an embodiment includes a silicon carbide substrate 10, a gate insulating film 20, a gate electrode 30, an interlayer insulating film 40a, and a gate interconnection 32. Silicon carbide substrate 10 has a main surface 10a. Silicon carbide substrate 10 includes: a first impurity region 13 that has a first conductivity type; a second impurity region 14 that is provided on first impurity region 13 and that has a second conductivity type different from the first conductivity type; and a third impurity region 15 that is provided on second impurity region 14 so as to be separated from first impurity region 13, that forms main surface 10a, and that has the first conductivity type. Main surface 10a of silicon carbide substrate 10 is provided with a trench 17. Trench 17 has a side portion 17a and a bottom portion 17b, side portion 17a extending to first impurity region 13 through third impurity region 15 and second impurity region 14, bottom portion 17b being located in first impurity region 13. Gate insulating film 20 is in contact with a corner portion 17c formed by side portion 17a and main surface 10a, bottom portion 17b and side portion 17a. Gate electrode 30 is in contact with gate insulating film 20 within trench 17. In interlayer insulating film 40a, an opening 40a1 is formed to expose a portion of gate electrode 30. Gate interconnection 32 is disposed in the opening and in contact with gate electrode 30. When viewed in a cross section, interlayer insulating film 40a extends from above third impurity region 15 to above gate electrode 30 so as to cover corner portion 17c.

In accordance with silicon carbide semiconductor device 1 according to (1), when viewed in a cross section, interlayer insulating film 40a extends from above third impurity region 15 to above gate electrode 30 so as to cover corner portion 17c. Accordingly, the insulating film on corner portion 17c can be effectively suppressed from being broken. As a result, the dielectric breakdown resistance of silicon carbide semiconductor device 1 can be improved.

(2) Preferably in silicon carbide semiconductor device 1 according to (1), gate interconnection 32 is made of a material having a melting point of not less than 1000° C. Accordingly, for example, even when gate interconnection 32 is heated to not less than 1000° C. in the alloying anneal step, gate interconnection 32 can be suppressed from being melted.

(3) Preferably in silicon carbide semiconductor device 1 according to (2), the material includes at least one material selected from a group consisting of W, Ni, WSi, and polysilicon. Accordingly, gate interconnection 32 can be effectively suppressed from being melted.

(4) Preferably in silicon carbide semiconductor device 1 according to any one of (1) to (3), interlayer insulating film 40 has a carbon concentration smaller than a carbon concentration of the gate insulating film. Accordingly, the insulating property of the insulating film is improved and leakage current can be reduced.

(5) Preferably in silicon carbide semiconductor device 1 according to any one of (1) to (4), gate interconnection 32 includes a barrier layer 32c in contact with each of gate electrode 30 and interlayer insulating film 40a. Accordingly, the insulation performance of silicon carbide semiconductor device 1 can be suppressed from being deteriorated by aluminum being diffused in interlayer insulating film 40a.

(6) Preferably in silicon carbide semiconductor device 1 according to (5), barrier layer 32c includes at least one of Ti and TiN. Accordingly, adhesion can be improved between interlayer insulating film 40a and gate interconnection 32.

(7) Silicon carbide semiconductor device 1 according to any one of (1) to (6) preferably further includes a gate pad 33 in contact with gate interconnection 32. Accordingly, voltage can be effectively applied to gate interconnection 32.

(8) Preferably in silicon carbide semiconductor device 1 according to any one of (1) to (7), side portion 17a of the trench includes a first plane S1 having a plane orientation of {0-33-8}. Accordingly, channel resistance in side portion 17a can be reduced, thereby reducing on-resistance.

(9) Preferably in silicon carbide semiconductor device 1 according to (8), side portion 17a of the trench microscopically includes first plane S1, and side portion 17a microscopically further includes a second plane S2 having a plane orientation of {0-11-1}. Accordingly, channel resistance in side portion 17a can be further reduced, thereby reducing on-resistance.

(10) Preferably in silicon carbide semiconductor device 1 according to (9), first plane S1 and second plane S2 of side portion 17a of the trench include a combined plane SR having a plane orientation of {0-11-2}. Accordingly, channel resistance in side portion 17a can be further reduced, thereby reducing on-resistance.

(11) Preferably in silicon carbide semiconductor device 1 according to (10), side portion 17a of the trench macroscopically has an off angle of 62±10° relative to a {000-1} plane. Accordingly, channel resistance in side portion 17a can be further reduced, thereby reducing on-resistance.

(12) A method Or manufacturing a silicon carbide semiconductor device according to an embodiment includes the following steps. There is prepared a silicon carbide substrate 10 having a main surface 10a. Silicon carbide substrate 10 includes: a first impurity region 13 that has a first conductivity type; a second impurity region 14 that is provided on first impurity region 13 and that has a second conductivity type different from the first conductivity type; and a third impurity region 15 that is provided on second impurity region 14 so as to be separated from first impurity region 13, that forms main surface 10a, and that has the first conductivity type. Main surface 10a of silicon carbide substrate 10 is provided with a trench 17. Trench 17 has a side portion 17a and a bottom portion 17b, side portion 17a extending to first impurity region 13 through third impurity region 15 and second impurity region 14, bottom portion 17b being located in first impurity region 13. A gate insulating film 20 is formed in contact with a corner portion 17c formed by side portion 17a and main surface 10a, bottom portion 17b, and side portion 17a. A gate electrode 30 is formed in contact with gate insulating film 20 within trench 17. An interlayer insulating film 40a is formed in which an opening 40a1 is formed to expose a portion of gate electrode 30. A gate interconnection 32 is formed to be disposed in opening 40a1 and in contact with gate electrode 30. When viewed in a cross section, interlayer insulating film 40 extends from above third impurity region 15 to above gate electrode 30 so as to cover corner portion 17c.

In accordance with the method for manufacturing silicon carbide semiconductor device 1 according to (12), when viewed in a cross section, interlayer insulating film 40a extends from above third impurity region 15 to above gate electrode 30 so as to cover corner portion 17c. Accordingly, the insulating film on corner portion 17c can be effectively suppressed from being broken. As a result, the dielectric breakdown resistance of silicon carbide semiconductor device 1 can be improved.

(13) Preferably in the method for manufacturing silicon carbide semiconductor device 1 according to (12), gate insulating film 20 is formed by thermally oxidizing silicon carbide substrate 10 in which trench 17 is formed. In this way, gate insulating film 20 having excellent insulation performance can be formed.

(14) Preferably in the method for manufacturing silicon carbide semiconductor device 1 according to (12) or (13), interlayer insulating film 40 is formed by a chemical vapor deposition method. Accordingly, as compared with a case where the insulating film is formed by thermal oxidation, thick interlayer insulating film 40 can be grown for a shorter period of time.

(15) The method for manufacturing silicon carbide semiconductor device 1 according to any one of (12) to (14) preferably further includes the step of forming an insulating layer 43 in contact with main surface 10a of silicon carbide substrate 10 in which trench 17 is formed. In the step of forming gate insulating film 20, side portion 17a and bottom portion 17b of trench 17 is thermally oxidized with insulating layer 43 being formed on main surface 10a. Accordingly, the thickness of the insulating film on corner portion 17c is increased, thereby improving the dielectric breakdown resistance of silicon carbide semiconductor device 1.

(16) Preferably in the method for manufacturing silicon carbide semiconductor device 1 according to any one of (12) to (15), the step of forming gate interconnection 32 includes the step of forming a barrier layer 32c in contact with each of gate electrode 30 and interlayer insulating film 40. Accordingly, the insulation performance of silicon carbide semiconductor device 1 can be suppressed from being deteriorated by aluminum being diffused in interlayer insulating film 40a.

(17) Preferably in the method for manufacturing silicon carbide semiconductor device 1 according to (16), barrier layer 32c includes at least one of Ti and TiN. Accordingly, adhesion can be improved between interlayer insulating film 40a and gate interconnection 32.

(18) The method for manufacturing silicon carbide semiconductor device 1 according to any one of (12) to (17) preferably further includes the step of forming a gate pad 33 in contact with gate interconnection 32. Accordingly, voltage can be effectively applied to gate interconnection 32.

(19) In the method for manufacturing silicon carbide semiconductor device 1 according to any one of (12) to (18), side portion 17a of trench 17 includes a first plane S1 having a plane orientation of {0-33-8}. Accordingly, channel resistance in side portion 17a can be reduced, thereby reducing on-resistance.

(20) Preferably in the method for manufacturing silicon carbide semiconductor device 1 according to (19), side portion 17a of trench 17 microscopically includes first plane S1, and side portion 17a microscopically further includes a second plane S2 having a plane orientation of {0-11-1}. Accordingly, channel resistance in side portion 17a can be further reduced, thereby reducing on-resistance.

(21) Preferably in the method for manufacturing silicon carbide semiconductor device 1 according to (20), first plane S1 and second plane S2 of side portion 17a of trench 17 include a combined plane SR having a plane orientation of {0-11-2}. Accordingly channel resistance in side portion 17a can be further reduced, thereby reducing on-resistance.

(22) Preferably in the method for manufacturing silicon carbide semiconductor device 1 according to (21), side portion 17a of trench 17 macroscopically has an off angle of 62±10° relative to a {000-1} plane. Accordingly, channel resistance in side portion 17a can be further reduced, thereby reducing on-resistance.

[Details of Embodiments of the Invention of the Present Application]

First, the following describes a configuration of a silicon carbide semiconductor device 1 according to one embodiment of the present invention.

With reference to FIG. 1 to FIG. 4, a MOSFET 1 serving as the silicon carbide semiconductor device of the present embodiment mainly includes a silicon carbide substrate 10, a gate insulating film 20, a gate electrode 30, an interlayer insulating film 40, a gate interconnection 32, a source electrode 60, a source interconnection layer 65, a drain electrode 70, and a lower pad electrode 80.

Silicon carbide substrate 10 has a first main surface 10a, and a second main surface 10b opposite to first main surface 10a. Silicon carbide substrate 10 includes a silicon carbide single crystal substrate 11 and a silicon carbide epitaxial layer 12 provided on silicon carbide single crystal substrate 11. Silicon carbide single crystal substrate 11 has a hexagonal crystal structure of polytype 4H, for example. Silicon carbide single crystal substrate 11 includes an impurity such as nitrogen, and is of n type (first conductivity type).

Silicon carbide epitaxial layer 12 of silicon carbide substrate 10 mainly includes a drift region 13, a body region 14, a source region 15, a contact region 16, and an electric field relaxing region 18.

Drift region 13 (first impurity region) includes a donor impurity such as nitrogen, and is of n type. Drill region 13 has an impurity concentration lower than that of silicon carbide single crystal substrate 11. Drift region 13 has an impurity concentration of, for example, not less than $1 \times 10^{15}$ cm$^{-3}$ and not more than $5 \times 10^{16}$ cm$^{-3}$. Drift region 13 has a thickness of about 15 μm for example.

Body regions 14 (second impurity region) includes an acceptor impurity such as aluminum, and is of p type (second conductivity type) different from n type. Body region 14 is provided on and in contact with drift region 13. Body region 14 has an impurity concentration of, for example, not less than $1 \times 10^{17}$ cm$^{-3}$ and not more than $5 \times 10^{18}$ cm$^{-3}$.

Source regions 15 (third impurity region) includes a donor impurity such as phosphorus, and is of n type. Source region 15 is provided on body region 14 such that source region 15 is separated from drift region 13 by body region 14. Contact region 16 includes an acceptor impurity such as aluminum, and is of p type. Contact region 16 is in contact with source region 15, and connects source electrode 60 and body region 14 to each other. Source region 15 and contact region 16 form first main surface 10a of silicon carbide substrate 10.

Figure 3:
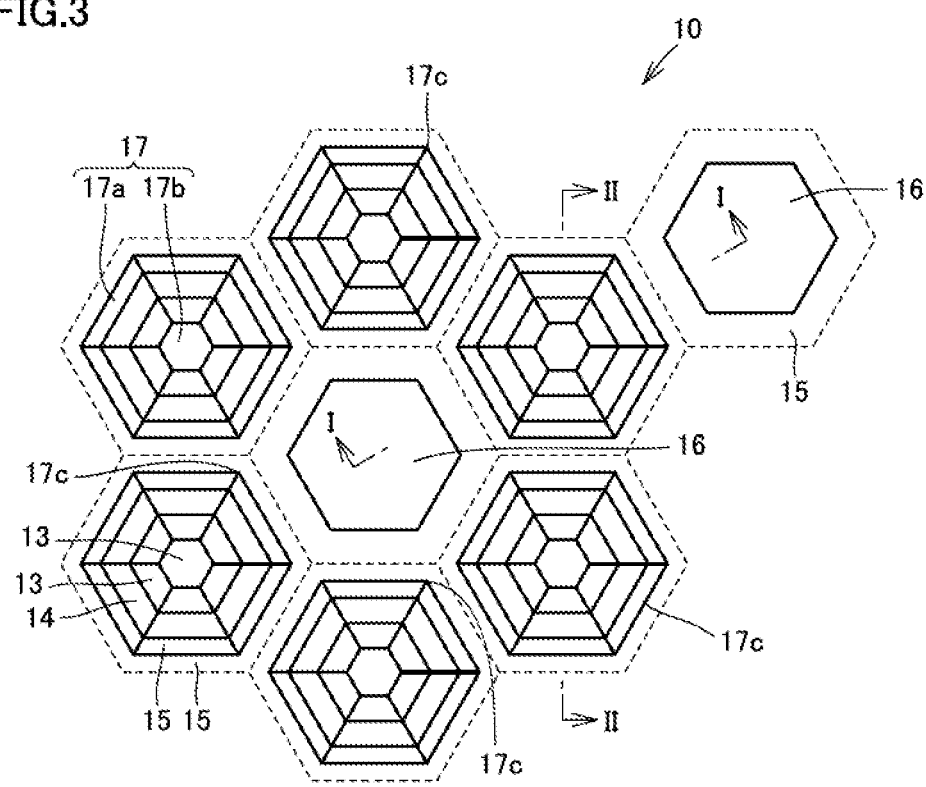
FIG. 3 is a partial schematic plan view schematically showing a configuration of a silicon carbide substrate according to the embodiment of the present invention.
Figure 4:
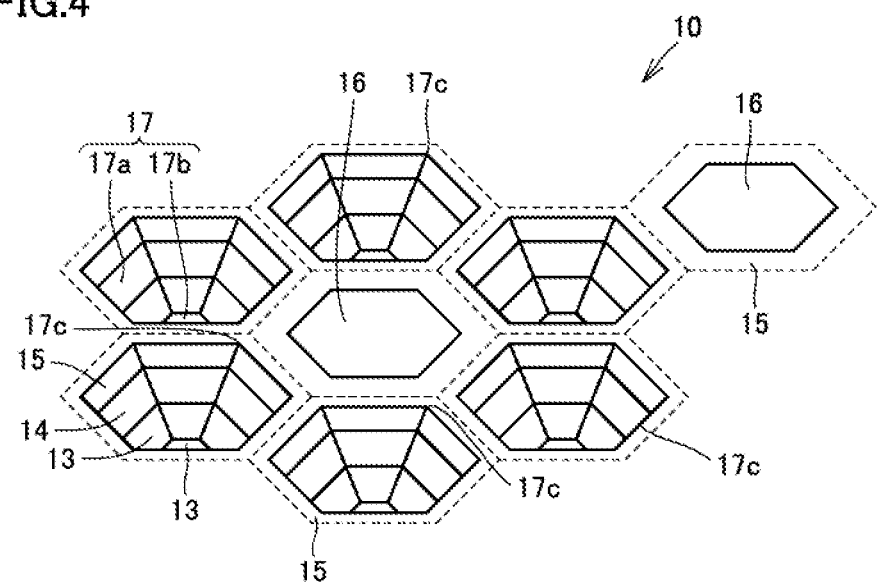
FIG. 4 is a partial schematic perspective view schematically showing the configuration of the silicon carbide substrate according to the embodiment of the present invention.

With reference to FIG. 3 and FIG. 4, a trench 17 is provided in first main surface 10a of silicon carbide substrate 10. Trench 17 has a side portion 17a and a bottom portion 17b, side portion 17a extending to drift region 13 through source region 15 and body region 14, bottom portion 17b being located in drift region 13. In other words, each of drift region 13, body region 14, and source region 15 is in contact with side portion 17a of trench 17. Drift region 13 is in contact with bottom portion 17b of trench 17. Side portion 17a of trench 17 is continuously connected to bottom portion 17b.

When viewed in a plan view (field of view seen in a direction normal to second main surface 10b of silicon carbide substrate 10), bottom portion 17b of trench 17 preferably has a polygonal shape such as a hexagonal shape. When viewed in a plan view, a plurality of trenches 17 may be formed to partially surround contact region 16, for example. A plurality of trenches 17 may be provided to interpose contact region 16 therebetween. Regarding trenches 17 according to the present embodiment, six trenches are provided to face respective sides of contact region 16 having a hexagonal shape. In other words, contact region 16 is disposed to be surrounded by six trenches 17. When viewed in a plan view, trench 17 may be provided to be interposed between two contact regions 16. On body region 14, side portion 17a of trench 17 includes a channel surface CH (see FIG. 1) of MOSFET 1. When viewed in a plan view, a corner portion 17c, which is formed by first main surface 10a of silicon carbide substrate 10 and side portion 17a of trench 17, has a polygonal shape, preferably, a hexagonal shape. Corner portion 17c may be a position on a side of a hexagon or may be a position on a vertex of a hexagon.

Side portion 17a of trench 17 is inclined relative to first main surface 10a of silicon carbide substrate 10, whereby trench 17 is expanded toward the opening in a tapered manner. First main surface 10a of silicon carbide substrate 10 corresponds to, for example, a {000-1} plane, and preferably corresponds to a (000-1) plane. Side portion 17a of trench 17 preferably has a plane orientation inclined relative to a {001} plane by not less than 50° and not more than 70°, more preferably, inclined relative to the (000-1) plane by not less than 50° and not more than 70°. Preferably, side portion 17a of trench 17 is inclined by about not less than 50° and not more than 70° relative to bottom portion 17b. Preferably, side portion 17a has a predetermined crystal plane (also referred to as "special plane") particularly at its portion in contact with body region 14. Details of the special plane will be described later. Bottom portion 17b of trench 17 is substantially parallel to each of first main surface 10a and second main surface 10b of silicon carbide substrate 10.

With reference to FIG. 1 and FIG. 2 again, electric field relaxing region 18 includes an acceptor impurity such as aluminum, and is of p type. Electric field relaxing region 18 is provided between body region 14 and second main surface 10b of silicon carbide substrate 10 such that electric field relaxing region 18 is surrounded by drift region 13. In the direction normal to second main surface 10b of silicon carbide substrate 10, electric field relaxing region 18 is provided at the second main surface 10b side relative to bottom portion 17b of trench 17. Electric field relaxing region 18 is away from body region 14 by not less than 1 μm and not more than 5 μm, for example. For example, electric field relaxing region 18 has a dose amount of not less than $1 \times 10^{12}$ cm$^{-2}$ and not more than $1 \times 10^{15}$ cm$^{-2}$, preferably, not less than $1 \times 10^{13}$ cm$^{-2}$ and not more than $5 \times 10^{13}$ cm$^{-2}$.

Gate insulating film 20 is provided in contact with: corner portion 17c formed by side portion 17a of trench 17 and first main surface 10a of silicon carbide substrate 10; bottom portion 17b of trench 17; side portion 17a of trench 17; and first main surface 10a of silicon carbide substrate 10. Gate insulating film 20 is in contact with source region 15 at each of first main surface 10a of silicon carbide substrate 10 and side portion 17a of trench 17, is in contact with body region 14 at side portion 17a of trench 17, and is in contact with drift region 13 at each of side portion 17a and bottom portion 17b of the trench. Gate insulating film 20 is made of, for example, silicon dioxide.

Gate electrode 30 is in contact with gate insulating film 20 within trench 17. Specifically, gate electrode 30 is provided to face each of source region 15, body region 14, and drill region 13 with gate insulating film 20 interposed therebetween. Gate electrode 30 is formed of a material including polysilicon having an impurity doped therein, for example.

Figure 2:
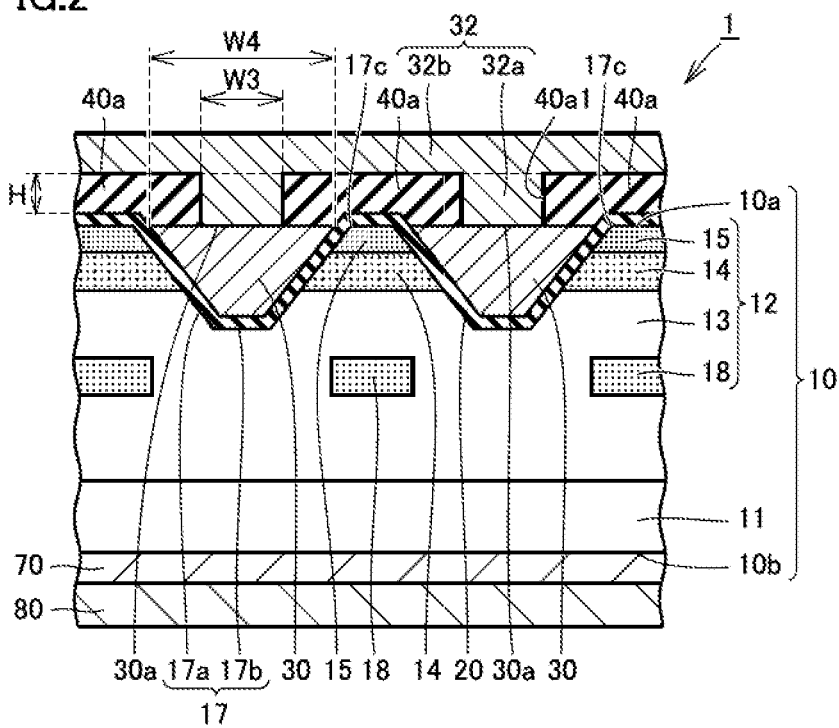
FIG. 2 is a partial schematic cross sectional view in a region II-II of FIG. 3.

With reference to FIG. 1 and FIG. 2, interlayer insulating film 40 includes a first interlayer insulating film 40a and a second interlayer insulating film 40b provided on first interlayer insulating film 40a. When viewed in a cross section, first interlayer insulating film 40a is provided to extend from above source region 15 to above gate electrode 30 so as to cover corner portion 17c formed by side portion 17a of trench 17 and first main surface 10a of silicon carbide substrate 10. First interlayer insulating film 40a is in contact with a portion of an upper surface 30a of gate electrode 30, and is in contact with gate insulating film 20 on corner portion 17c. With reference to FIG. 2, first interlayer insulating film 40a is provided to extend over source region 15 from the upper surface of one gate electrode 30 provided in one of two adjacent trenches 17, 17 to the upper surface of the other gate electrode 30 provided in the other trench 17.

First interlayer insulating film 40a has an opening 40a1 through which the central portion of the upper surface of gate electrode 30 is exposed. When viewed in a cross section (field of view seen in a direction parallel to second main surface 10b of silicon carbide substrate 10), opening 40a1 has a width W1, W3 smaller than a width W2, W4 of upper surface 30a of gate electrode 30. Opening 40a1 has width W1, W3 of, for example, not less than 0.5 μm and not more than 3.0 μm. Upper surface 30a of gate electrode 30 has width W2, W4 of, for example, not less than 1.0 μm and not more than 5.0 μm. Each of first interlayer insulating film 40a and second interlayer insulating film 40b is made of a material including silicon dioxide, for example. At least one of first interlayer insulating film 40a and second interlayer insulating film 40b may be made of a material including SiON or SiN. Preferably, first interlayer insulating film 40a has a carbon concentration less than the carbon concentration of the gate insulating film. First interlayer insulating film 40a has a thickness H of, for example, about not less than 0.1 μm and not more than 2 μm, preferably, about not less than 0.3 μm and not more than 10 μm.

Gate interconnection 32 is disposed in opening 40a1 formed in interlayer insulating film 40, and is in contact with gate electrode 30. Width W1 of gate interconnection 32 in a direction along an interface 30a between gate electrode 30 and gate interconnection 32 is smaller than width W2 of gate electrode 30. Gate interconnection 32 includes a first gate interconnection portion 32a and a second gate interconnection portion 32b. First gate interconnection portion 32a is in contact with gate electrode 30, and is disposed in opening 40a1 formed in interlayer insulating film 40. Second gate interconnection portion 32b is provided on and in contact with first gate interconnection portion 32a, and has a width larger than width W1 of first gate interconnection portion 32a. Preferably, gate interconnection 32 is made of a material having a melting point of not less than 1000° C. Specifically, the material of gate interconnection 32 includes at least one material selected from a group consisting of W (tungsten), Ni (nickel), WSi (tungsten silicide) and polysilicon.

In interlayer insulating film 40 and gate insulating film 20, an opening 40a2 is formed via which contact region 16 and a portion of source region 15 are exposed at first main surface 10a of silicon carbide substrate 10. Source electrode 60 is in contact with each of source region 15 and contact region 16 at first main surface 10a of silicon carbide substrate 10. Source interconnection layer 65 is provided on and in contact with source electrode 60, and is electrically connected to source electrode 60. Source interconnection layer 65 is, for example, a layer including aluminum. Interlayer insulating film 40 insulates between gate electrode 30 and source electrode 60.

Figure 5:
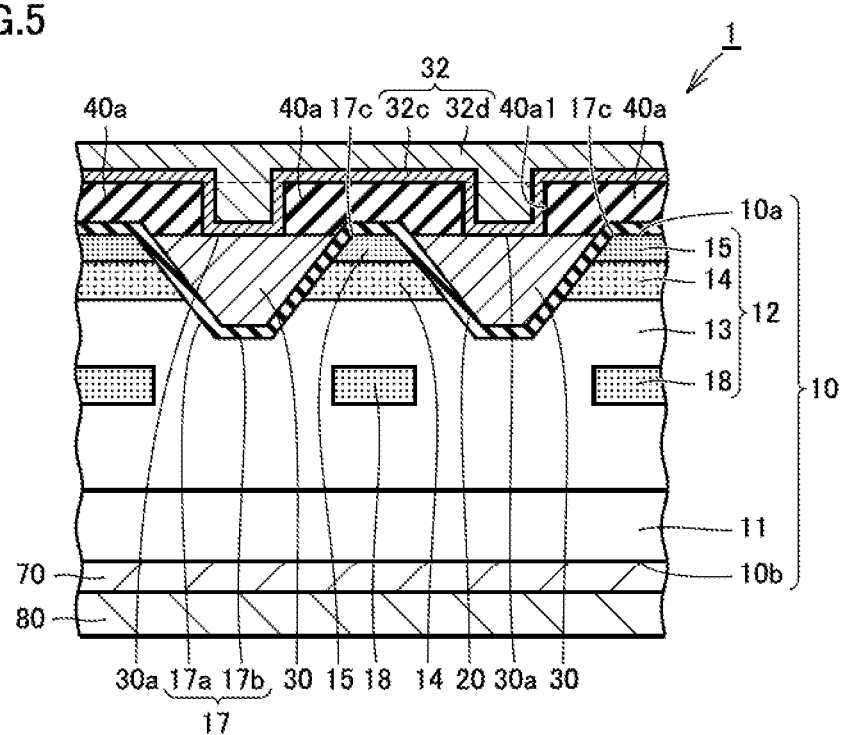
FIG. 5 is a schematic cross sectional view schematically showing a configuration of a first modification of the silicon carbide semiconductor device according to the embodiment of the present invention.

With reference to FIG. 5, gate interconnection 32 may include a barrier layer 32c in contact with each of gate electrode 30 and interlayer insulating film 40. For example, barrier layer 32c is in contact with the upper surface of first interlayer insulating film 40a and its wall surface that forms opening 40a1 in first interlayer insulating film 40a, and is in contact with upper surface 30a of gate electrode 30. Preferably, barrier layer 32c includes at least one of Ti and TiN.

Figure 6:
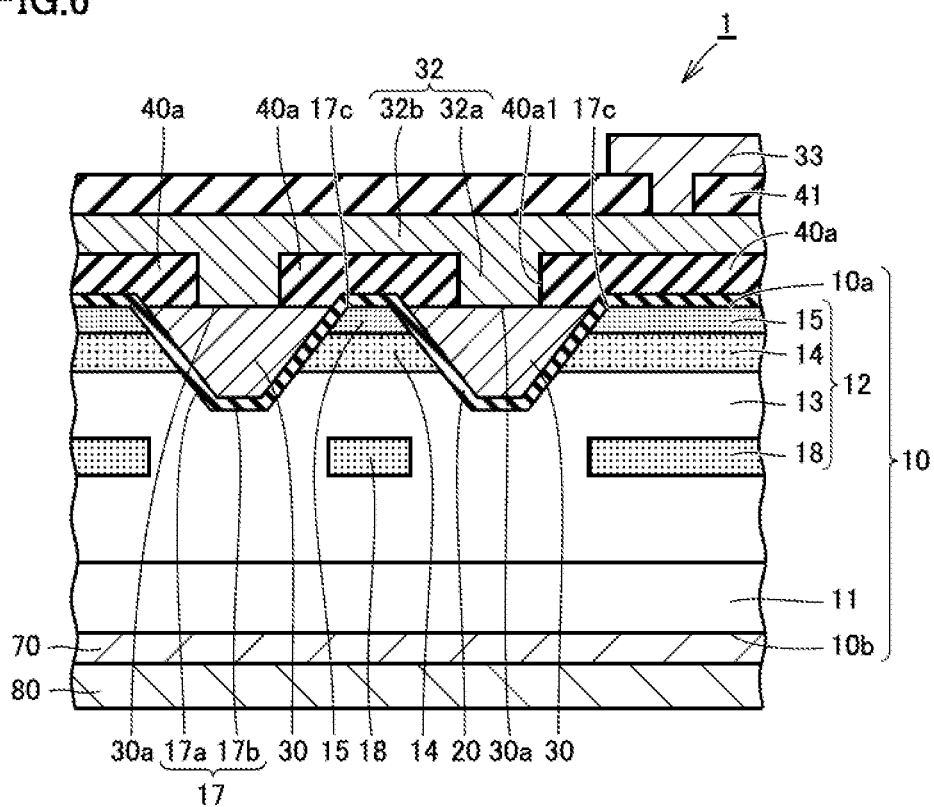
FIG. 6 is a schematic cross sectional view schematically showing a configuration of a second modification of the silicon carbide semiconductor device according to the embodiment of the present invention.

With reference to FIG. 6, MOSFET 1 may further include a gate pad 33. Gate pad 33 is provided on and in contact with gate interconnection 32, and is configured to be capable of applying voltage to gate electrode 30. Interlayer insulating film 41 provided on gate interconnection 32 is provided with an opening, via which gate pad 33 is electrically connected to gate interconnection 32. Gate pad 33 is made of a material including AlSiCu, for example. Second gate interconnection portion 32b of gate interconnection 32 is disposed between first interlayer insulating film 40a and interlayer insulating film 41.

(Special Plane)

Figure 7:
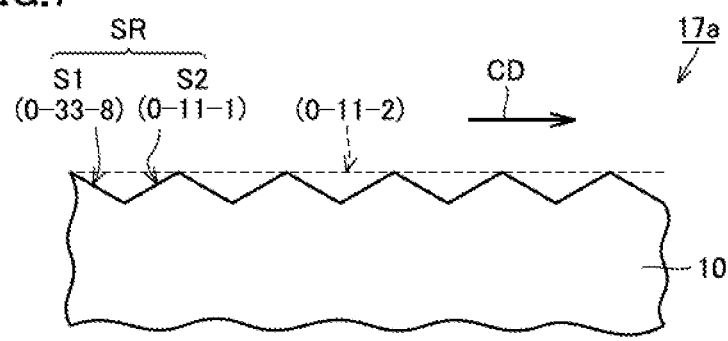
FIG. 7 is a partial schematic cross sectional view schematically showing a fine structure of the side portion of the trench provided in the silicon carbide semiconductor device.

Side portion 17a of trench 17 described above has a special plane particularly at its portion on body region 14. As shown in FIG. 7, side portion 17a having the special plane includes a plane S1 (first plane) having a plane orientation of {0-33-8}. In other words, on side portion 17a of trench 17, body region 14 is provided with a surface including plane S1. Plane S1 preferably has a plane orientation of (0-33-8).

More preferably, side portion 17a microscopically includes plane S1, and side portion 17a microscopically further includes a plane S2 (second plane) having a plane orientation of {0-11-1}. Here, the term "microscopically" refers to "minutely to such an extent that at least the size about twice as large as an interatomic spacing is considered". As a method for observing such a microscopic structure, for example, a TEM (Transmission Electron Microscope) can be used. Plane S2 preferably has a plane orientation of (0-11-1).

Preferably, plane S1 and plane S2 of side portion 17a form a combined plane SR having a plane orientation of {0-11-2}. That is, combined plane SR is formed of periodically repeated planes S1 and S2. Such a periodic structure can be observed by, for example, a TEM or an AFM (Atomic Force Microscopy). In this case, combined plane SR has an off angle of 62° relative to the {000-1} plane, macroscopically. Here, the term "macroscopically" refers to "disregarding a fine structure having a size of approximately interatomic spacing". For the measurement of such a macroscopic off angle, a method employing general X-ray diffraction can be used, for example. Preferably, combined plane SR has a plane orientation of (0-11-2). In this case, combined plane SR has an off angle of 62° relative to the (000-1) plane, macroscopically.

Preferably, a channel direction CD, which is a direction in which a carrier flows on the channel surface (i.e., the thickness direction of the MOSFET (longitudinal direction in FIG. 1 or the like)), is along the direction in which the above-described periodic repetition is made.

The following describes a detailed structure of combined plane SR.

Figure 8:
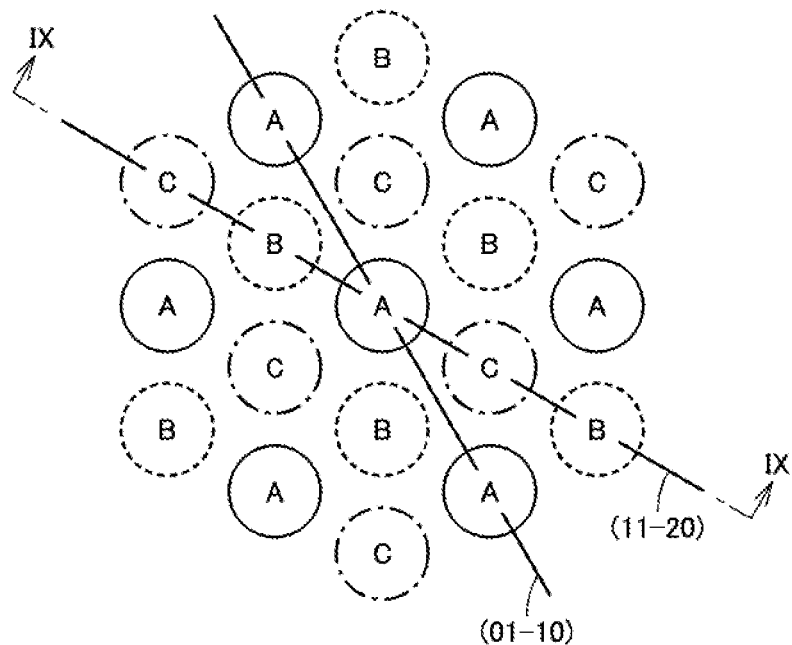
FIG. 8 shows a crystal structure of a (000-1) plane in a hexagonal crystal of polytype 4H.

Generally, regarding S1 atoms (or C atoms), when viewing a silicon carbide single crystal of polytype 4H from the (000-1) plane, atoms in a layer A (solid line in the figure), atoms in a layer B (broken line in the figure) disposed therebelow, and atoms in a layer C (chain line in the figure) disposed therebelow, and atoms in a layer B (not shown in the figure) disposed therebelow are repeatedly provided as shown in FIG. 8. In other words, with four layers ABCB being regarded as one period, a periodic stacking structure such as ABCBABCBABCB . . . is provided.

Figure 9:
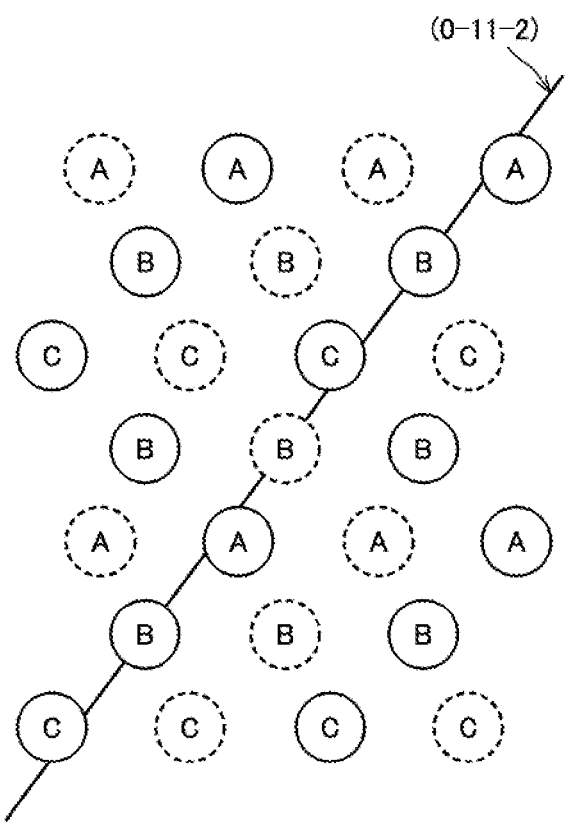
FIG. 9 shows a crystal structure of a (11-20) plane along a line XXV-XXV in FIG. 8.

As shown in FIG. 9, in the (11-20) plane (cross section taken along a line IX-IX of FIG. 8), atoms in each of four layers ABCB constituting the above-described one period are not aligned completely along the (0-11-2) plane. In FIG. 9, the (0-11-2) plane is illustrated to pass through the locations of the atoms in layers B. In this case, it is understood that each of atoms in layers A and C is deviated from the (0-11-2) plane. Hence, even when the macroscopic plane orientation of the surface of the silicon carbide single crystal, i.e., the plane orientation thereof with its atomic level structure being ignored is limited to (0-11-2), this surface can have various structures microscopically.

Figure 10:
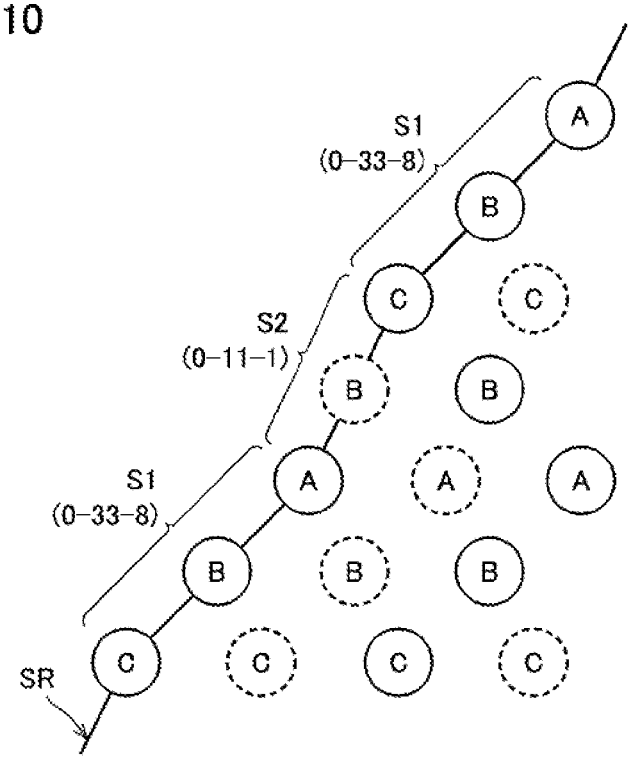
FIG. 10 shows a crystal structure in the vicinity of a surface of a combined plane of FIG. 7 within a (11-20) plane.

As shown in FIG. 10, combined plane SR is constructed by alternately providing planes S1 having a plane orientation of (0-33-8) and planes S2 connected to planes S1 and having a plane orientation different from that of each of planes S1. Each of planes S1 and S2 has a length twice as large as the interatomic spacing of the Si atoms (or C atoms). It should be noted that a plane with plane S1 and plane S2 being averaged corresponds to the (0-11-2) plane (FIG. 9).

Figure 11:
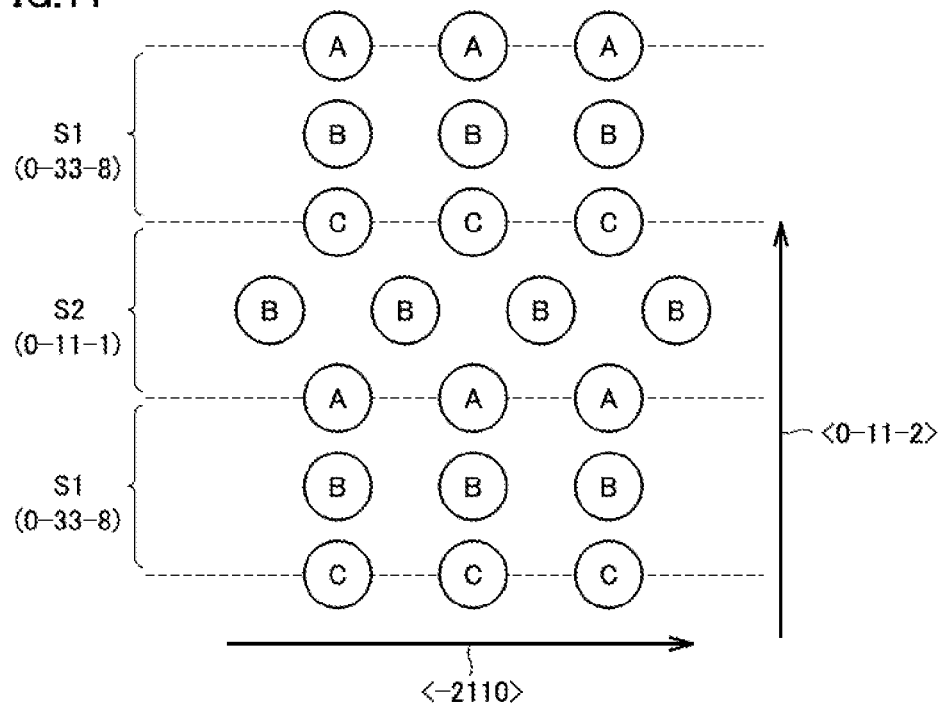
FIG. 11 shows the combined plane of FIG. 7 when viewed from a (01-10) plane.

As shown in FIG. 11, when viewing combined plane SR from the (01-10) plane, the single crystal structure has a portion periodically including a structure (plane S1 portion) equivalent to a cubic structure. Specifically, combined plane SR is constructed by alternately providing planes S1 having a plane orientation of (001) in the above-described structure equivalent to the cubic structure and planes S2 connected to planes S1 and having a plane orientation different from that of each of planes S1. Also in a polytype other than 4H, the surface can be thus constituted of the planes (planes S1 in FIG. 7) having a plane orientation of (001) in the structure equivalent to the cubic structure and the planes (planes S2 in FIG. 7) connected to the foregoing planes and having a plane orientation different from that of each of the foregoing planes. The polytype may be 6H or 15R, for example.

Figure 12:
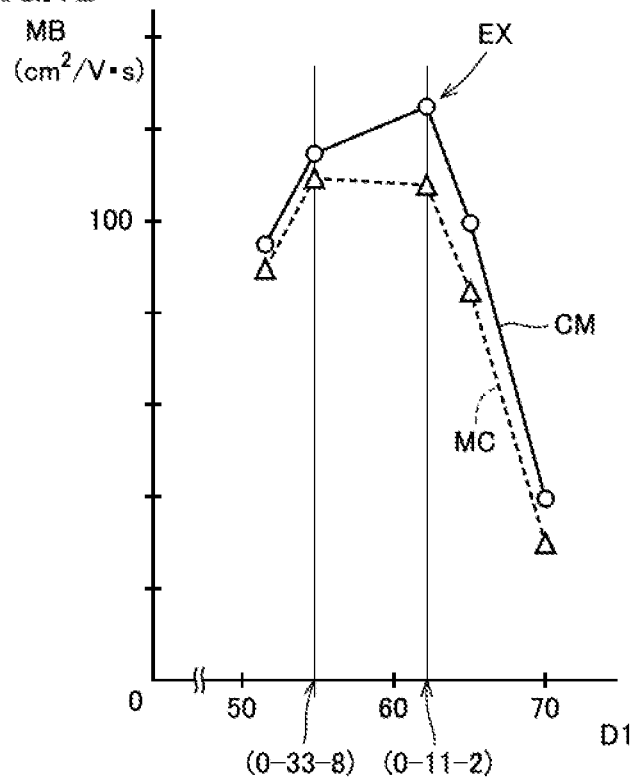
FIG. 12 is a graph showing an exemplary relation between channel mobility and an angle between a channel surface and the (000-1) plane when macroscopically viewed, in each of a case where thermal etching is performed and a case where no thermal etching is performed.

Next, with reference to FIG. 12, the following describes a relation between the crystal plane of side portion 17a and mobility MB of the channel surface. In a graph of FIG. 12, the horizontal axis represents an angle D1 between a macroscopic plane orientation of side portion 17a having the channel surface and the (000-1) plane, whereas the vertical axis represents mobility MB. A group of plots CM correspond to a case where side portion 17a is finished to correspond to the special plane by thermal etching, whereas a group of plots MC correspond to a case where side wall 17a is not thermally etched.

In group of plots MC, mobility MB is at maximum when the channel surface has a macroscopic plane orientation of (0-33-8). This is presumably due to the following reason. That is in the case where the thermal etching is not performed, i.e., in the case where the microscopic structure of the channel surface is not particularly controlled, the macroscopic plane orientation thereof corresponds to (0-33-8), with the result that a ratio of the microscopic plane orientation of (0-33-8), i.e., the plane orientation of (0-33-8) in consideration of that in atomic level becomes statistically high.

On the other hand, mobility MB in group of plots CM is at maximum when the macroscopic plane orientation of the channel surface is (0-11-2) (arrow EX). This is presumably due to the following reason. That is, as shown in FIG. 10 and FIG. 11, the multiplicity of planes S1 each having a plane orientation of (0-33-8) are densely and regularly arranged with planes S2 interposed therebetween, whereby a ratio of the microscopic plane orientation of (0-33-8) becomes high in the channel surface.

Figure 13:
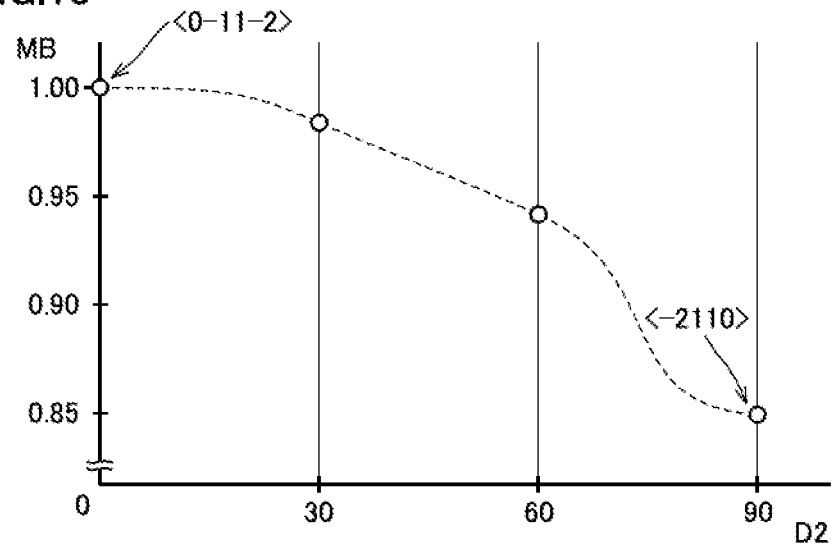
FIG. 13 is a graph showing an exemplary relation between the channel mobility and an angle between a channel direction and a <0-11-2> direction.

It should be noted that mobility MB has orientation dependency on combined plane SR. In a graph shown in FIG. 13 the horizontal axis represents an angle D2 between the channel direction and the <0-11-2> direction, whereas the vertical axis represents mobility MB (in any unit) in the channel surface. A broken line is supplementarily provided therein for viewability of the graph. From this graph, it has been found that in order to increase channel mobility MB, channel direction CD (FIG. 7) preferably has an angle D2 of not less than 0° and not more than 60°, more preferably, substantially 0°.

Figure 14:
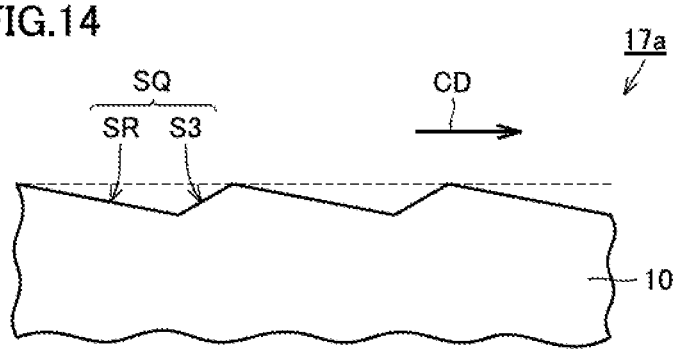
FIG. 14 shows a modification of FIG. 7.

As shown in FIG. 14, side portion 17a may further include a plane S3 (third plane) m addition to combined plane SR. More specifically, side portion 17a may include a combined plane SQ constituted of periodically repeated plane S3 and combined plane SR. In this case, the off angle of side portion 17a relative to the {000-1} plane is deviated from the ideal off angle of combined plane SR, i.e., 62°. Preferably, this deviation is small, preferably, in a range of ±10°. Examples of a surface included in such an angle range include a surface having a macroscopic plane orientation of the {0-33-8} plane. More preferably, the of angle of side portion 17a relative to the (000-1) plane is deviated from the ideal off angle of combined plane SR, i.e., 62°. Preferably, this deviation is small, preferably, in a range of ±10. Examples of a surface included in such an angle range include a surface having a macroscopic plane orientation of the (0-33-8) plane.

Such a periodic structure can be observed using a TEM or an AFM, for example.

Figure 15:
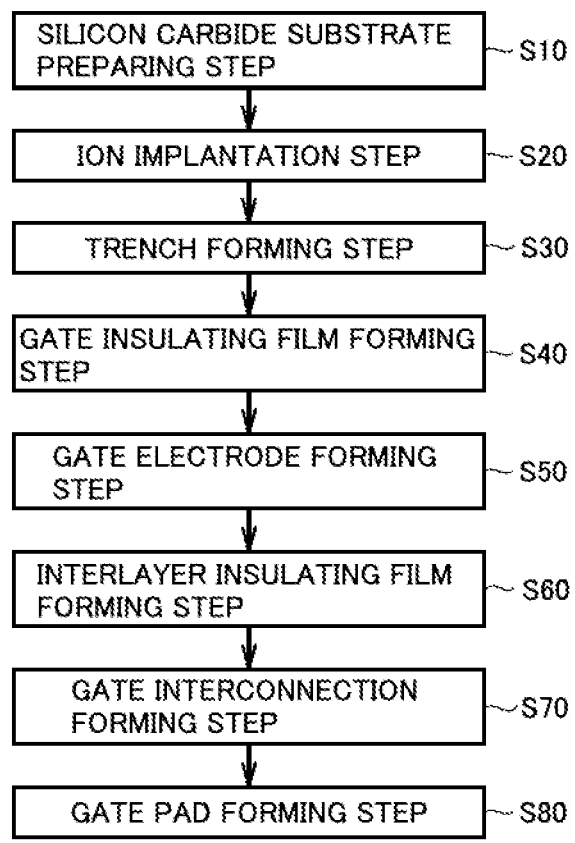
FIG. 15 is a flowchart schematically showing a method for manufacturing the silicon carbide semiconductor device according to the embodiment of the present invention.

Next, the following describes a method for manufacturing MOSFET 1 (FIG. 1) serving as the silicon carbide semiconductor device according to the present embodiment with reference to FIG. 15.

Figure 16:
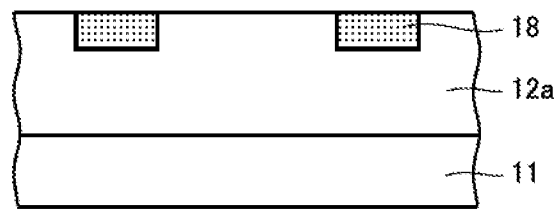
FIG. 16 is a partial schematic cross sectional view schematically showing a first step of the method for manufacturing the silicon carbide semiconductor device according to the embodiment of the present invention.

First, a silicon carbide substrate preparing step (S10: FIG. 15) is performed. With reference to FIG. 16, a lower drift layer 12a to serve as a portion of drift region 13 (FIG. 1) is formed on silicon carbide single crystal substrate 11. Specifically, lower drill layer 12a of n type is formed through epitaxial growth on silicon carbide single crystal substrate 11. The epitaxial growth can be achieved by employing a CVD (Chemical Vapor Deposition) method that utilizes a mixed gas of silane ($SiH_4$) and propane ($C_3H_8$) as a material gas and utilizes hydrogen gas ($H_2$) as a carrier gas, for example. During the epitaxial growth, it is preferable to introduce nitrogen (N) or phosphorus (P) as an impurity, for example.

As shown in FIG. 16, electric field relaxing region 18 of p type is formed in a portion of lower drift layer 12a. Specifically, after forming an implantation mask (not shown) on lower drift layer 12a, acceptor ions (impurity ions tot providing p type are implanted in lower drift layer 12a using the implantation mask.

Figure 17:
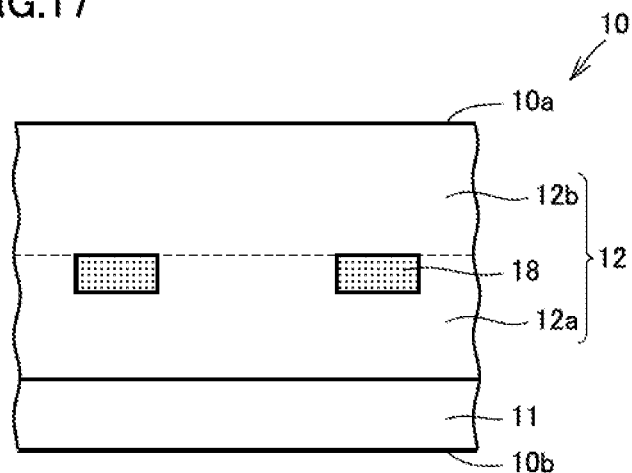
FIG. 17 is a partial schematic cross sectional view schematically showing a second step of the method for manufacturing the silicon carbide semiconductor device according to the embodiment of the present invention.

As shown in FIG. 17, after electric field relaxing region 18 is formed, an upper drift layer 12b of n type is formed on lower drift layer 12a. Accordingly, electric field relaxing region 18 is buried in drift region 13 including lower drift layer 12a and upper drift layer 12b. Upper drift layer 12b can be formed by the same formation method as that for lower drift layer 12a.

Figure 18:
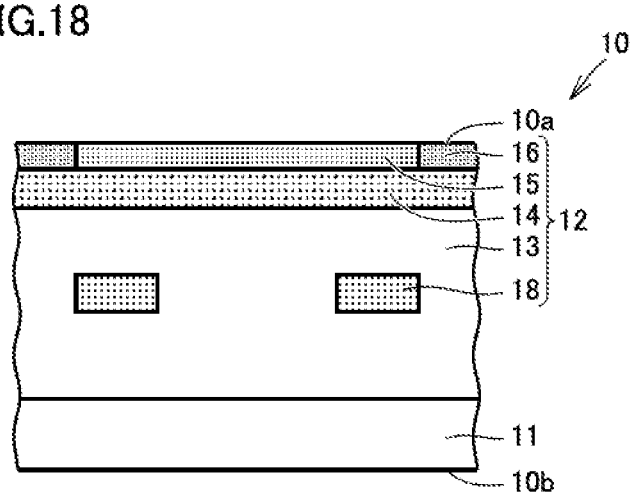
FIG. 18 is a partial schematic cross sectional view schematically showing a third step of the method for manufacturing the silicon carbide semiconductor device according to the embodiment of the present invention.

Next, an ion implantation step (S20: FIG. 15) is performed. As shown in FIG. 18, body region. 14 is formed on drift region 13, and source region 15 and contact region 16 are formed on body region 14. Each of body region 14, source region 15, and contact region 16 is formed by implanting ions into drift region 13, for example. In the ion implantation for forming body region 14 and contact region 16, ions of an impurity for providing p type such as aluminum (Al) are implanted. Meanwhile, in the ion implantation for forming source region 15, ions of an impurity for providing n type such as phosphorus (P) are implanted, for example. It should be noted that instead of the ion implantation, body region 14, source region 15, and contact region 16 may be formed through epitaxial growth involving addition of an impurity.

Next, a heat treatment (activation annealing) is performed in order to activate the impurities provided in silicon carbide substrate 10 by the ion implantations. The activation annealing is preferably performed at a temperature of not less than 1500° C. and not more than 1900° C., for example, a temperature of approximately 1700° C. The activation annealing is performed for approximately 30 minutes, for example. The atmosphere of the activation annealing is preferably an inert gas atmosphere, such as Ar atmosphere.

Figure 19:
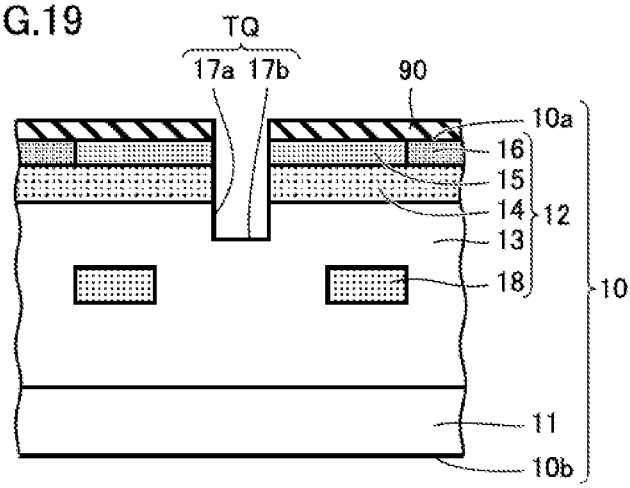
FIG. 19 is a partial schematic cross sectional view schematically showing a fourth step of the method for manufacturing the silicon carbide semiconductor device according to the embodiment of the present invention.

Next, a trench forming step (S30: FIG. 15) is performed. With reference to FIG. 19, a mask layer 90 having an opening is formed on first main surface 10a including source region 15 and contact region 16. As mask layer 90, a silicon oxide film or the like can be used, for example. The opening is formed to correspond to the position of trench 17 (FIG. 1).

As shown in FIG. 19, in the opening of mask layer 90, source region 15, body region 14, and a portion of drift region 13 are removed by etching, An exemplary, usable etching method is reactive ion etching (RIE), in particular, inductively coupled plasma (ICP) RIE. Specifically, for example, ICP-RIE can be employed which utilizes $SF_6$ or mixed gas of $SF_6$ and $O_2$ as reactive gas. By means of such etching, in a region in which trench 17 (FIG. 1) is to be formed, a recess TQ is formed which includes: side portion 17a substantially perpendicular first main surface 10a; and bottom portion 17b continuously connected to side portion 17a and substantially parallel to first main surface 10a.

Next, thermal etching is performed in recess TQ. This thermal etching can be performed by, for example, heating in an atmosphere containing reactive gas having at least one or more types of halogen atom. The at least one or more types of halogen atom include at least one of chlorine (Cl) atom and fluorine (F) atom. This atmosphere is, for example, $Cl_2$, $BCL_3$, $SF_6$, or $CF_4$. For example, the thermal etching is performed using a mixed gas of chlorine gas and oxygen gas as a reactive gas, at a heat treatment temperature of, for example, not less than 700° C. and not more than 1000° C.

It should be noted that the reactive gas may contain a carrier gas in addition to the chlorine gas and the oxygen gas. An exemplary, usable carrier gas is nitrogen ($N_2$) gas, argon gas, helium gas, or the like. When the heat treatment temperature is set at not less than 700° C. and not more than 1000° C. as described above, a rate of etching SiC is approximately, for example, 70 μm/hour. In addition, in the thermal etching, mask layer 90, which is formed of silicon oxide and therefore has a very large selection ratio relative to Sic, is not substantially etched during the etching of SiC.

Figure 20:
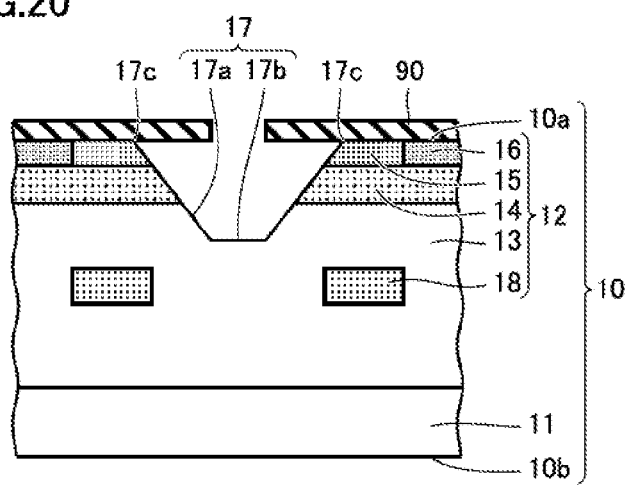
FIG. 20 is a partial schematic cross sectional view schematically showing a fifth step of the method for manufacturing the silicon carbide semiconductor device according to the embodiment of the present invention.

As shown in FIG. 20, by the thermal etching, trench 17 is formed in first main surface 10a of silicon carbide substrate 10. Trench 17 includes: side portion 17a extending to drill region 13 through source region 15 and body region 14; and bottom portion 17b located in drift region 13. Each of side portion 17a and bottom portion 17b is away from electric field relaxing region 18. When each of source region 15, body region 14, and drift region 13 is thermally etched to form side portion 17a of trench 17, mask layer 90 is not substantially etched, so that mask layer 90 remains to project front above first main surface 10a to above side portion 17a of trench 17. Next, mask layer 90 is removed by means of an appropriate method such as etching (see FIG. 21).

Preferably, side portion 17a of trench 17 is inclined relative to bottom portion 17b at an angle of, for example, not less than 50° and not more than 70°. Preferably, during the formation of trench 17, the special plane described above is spontaneously formed on side portion 17a, in particular, on body region 14. Specifically, side portion 17a of trench 17 includes first plane S1 having a plane Orientation of {0-33-8}. Preferably, side portion 17a of trench 17 microscopically includes first plane S1, and side portion 17a microscopically further includes second plane S2 having a plane orientation of {0-11-1}. More preferably, first plane S1 and second plane S2 of side portion 17a of trench 17 include combined plane SR having a plane orientation of {0-11-2}. Side portion 17a of trench 17 macroscopically has an off angle of 62°±10° relative to the {000-1} plane.

In this way, silicon carbide substrate 10 is prepared which has first main surface 10a and second main surface 10b opposite to first main surface 10a and in which trench 17 is formed in first main surface 10a. Silicon carbide substrate 10 includes: drift region 13 (first impurity region) that has n type; body region 14 that is provided on drift region 13 and that has p type; and source region 15 that is provided on body region 14 so as to be separated from drift region 13, that forms first main surface 10a, and that has n type.

Figure 22:
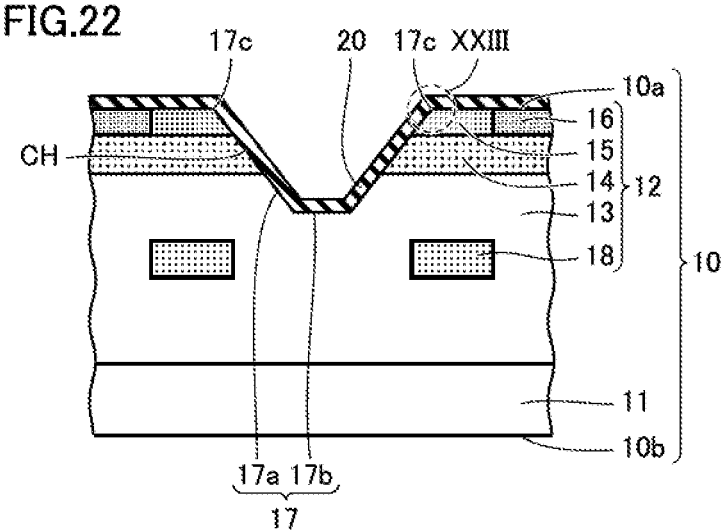
FIG. 22 is a partial schematic cross sectional view schematically showing a seventh step of the method for manufacturing the silicon carbide semiconductor device according to the embodiment of the present invention.

Next, a gate insulating film forming step (S40: FIG. 15) is performed. Preferably, gate insulating film 20 is formed by thermally oxidizing silicon carbide substrate 10 in which trench 17 is formed. Specifically, silicon carbide substrate 10 having trench 17 formed therein is heated at, for example, about 1300° C. in an atmosphere including oxygen, thereby forming Rate insulating film 20. As shown in FIG. 22, gate insulating film 20 is formed to cover side portion 17a and bottom portion 17b of trench 17 and first main surface 10a. Gate insulating film 20 is formed to cover corner portion 17c formed by side portion 17a of trench 17 and first main surface 10a of silicon carbide substrate 10.

Figure 23:
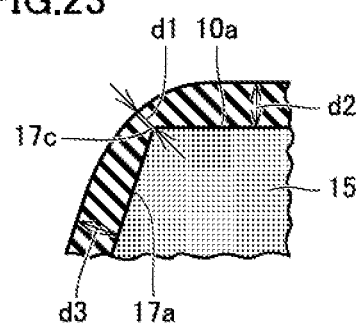
FIG. 23 is an enlarged view of a region XXIII of FIG. 22.

As shown in FIG. 23, thickness d1 of gate insulating film 20 in the vicinity of corner portion 17c is formed to be smaller than thickness d2 of gate insulating film 20 on first main surface 10a and thickness d3 of gate insulating film 20 on side portion 17a of trench 17. Accordingly, gate insulating film 20 in the vicinity of corner portion 17c becomes more likely to result in dielectric breakdown.

After thermally oxidizing silicon carbide substrate 10, a heat treatment (NO annealing) may be performed onto silicon carbide substrate 10 in a nitrogen monoxide (NO) gas atmosphere. In the NO annealing, silicon carbide substrate 10 is held for about 1 hour under a temperature of not less than 1100° C. and not more than 1300° C. Accordingly, nitrogen atoms are introduced in an interface region between gate insulating film 20 and body region 14. As a result, formation of interface states in the interface region is suppressed, thereby achieving improved channel mobility. It should be noted that a gas other than the NO gas may be employed as the atmospheric gas as long as the nitrogen atoms can be thus introduced. After the NO annealing, Ar annealing may be further performed using argon (Ar) as an atmospheric gas. The Ar annealing is preferably performed at a heating temperature equal to or higher than the heating temperature in the above-described NO annealing and lower than the melting point of gate insulating film 20. This heating temperature is held for approximately 1 hour, for example. Accordingly, formation of interface states in the interface region between gate insulating film 20 and body region 14 is further suppressed. It should be noted that instead of the Ar gas, an inert gas such as nitrogen gas may be employed as the atmospheric gas.

Figure 24:
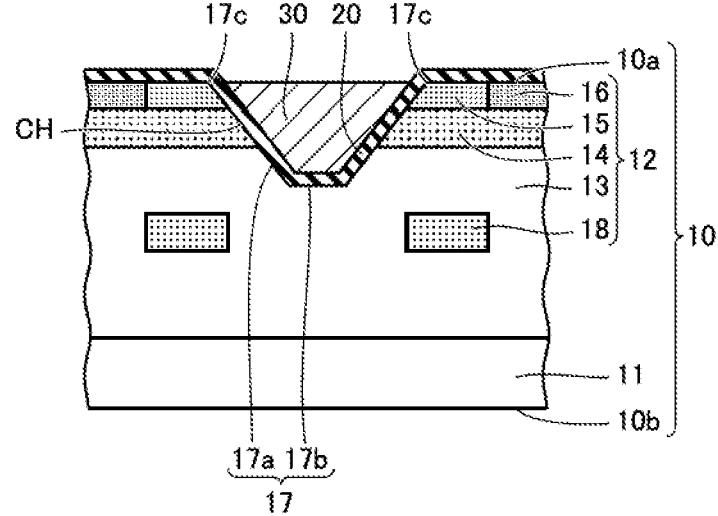
FIG. 24 is a partial schematic cross sectional view schematically showing an eighth step of the method for manufacturing the silicon carbide semiconductor device according to the embodiment of the present invention.

Next, a gate electrode forming step (S50: FIG. 15) is performed. As shown in FIG. 24, gate electrode 30 is formed in contact with gate insulating film 20 within trench 17. Gate electrode 30 is formed in trench 17 to face each of side portion 17a and bottom portion 17b of trench 17 with gate insulating film 20 interposed therebetween. Gate electrode 30 is formed by, for example, a LPCVD (Low Pressure Chemical Vapor Deposition) method. Gate electrode 30 is formed within trench 17 so as not to cover corner portion 17c.

Figure 25:
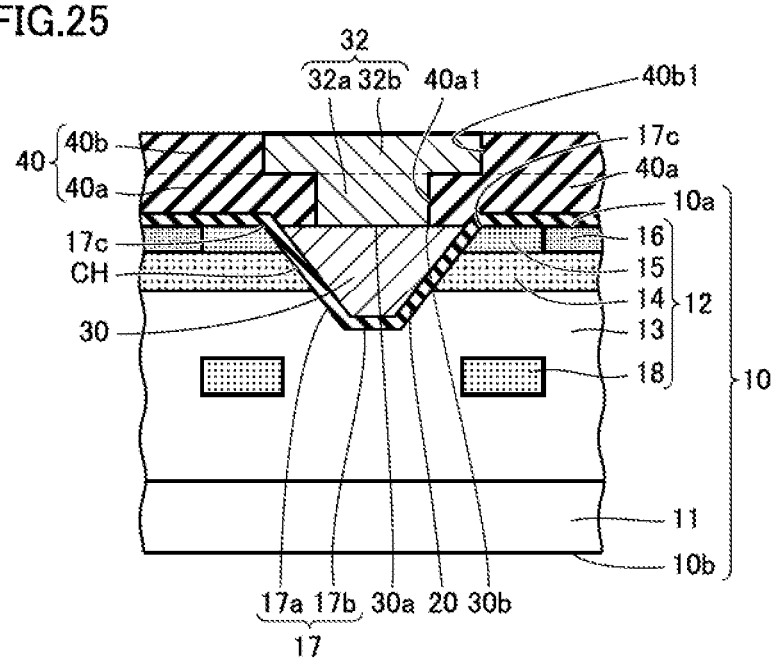
FIG. 25 is a partial schematic cross sectional view schematically showing a ninth step of the method for manufacturing the silicon carbide semiconductor device according to the embodiment of the present invention.

Next, an interlayer insulating film forming step (S60: FIG. 15) is performed. With reference to FIG. 25, interlayer insulating film 40 is formed which is provided with opening 40a1 and opening 40b1 to expose a portion of gate electrode 30. Specifically, interlayer insulating film 40 includes: first interlayer insulating film 40a in which opening 40a1 having a first width is formed; and a second interlayer insulating film 40b which is provided on first interlayer insulating film 40a and in which opening 40b1 having a second width larger than the first width is formed. Interlayer insulating film 40a is in contact with an outer circumferential region of upper surface 30a of gate electrode 30, and is not in contact with a central region of upper surface 30a. In other words, when viewed in a cross section, interlayer insulating film 40a is formed to extend from above source region 15 to above gate electrode 30 so as to cover corner portion 17c. Interlayer insulating film 40 is preferably formed by a deposition method, and is more preferably formed by a chemical vapor deposition method. Interlayer insulating film 40 is a material including silicon dioxide, for example.

Next, a gate interconnection forming step (S70: FIG. 15) is performed. Gate interconnection 32 is formed to fill opening 40a1 formed in first interlayer insulating film 40a, and is formed to fill opening 40a2 formed in second interlayer insulating film 40b. Gate interconnection 32 is formed in contact with gate electrode 30 at upper surface 30a of gate electrode 30. Preferably, gate interconnection 32 is made of a material having a melting point of not less than 1000° C. Specifically, the material of gate interconnection 32 includes at least one material selected from a group consisting of W (tungsten), Ni (nickel), WSi (tungsten silicide), and poly-silicon. Interlayer insulating film 41 is formed on gate interconnection 32.

The gate interconnection forming step may include the step of forming barrier layer 32c in contact with each of gate electrode 30 and interlayer insulating film 40. For example, barrier layer 32c is formed in contact with the upper surface of interlayer insulating film 40 and the wall surface forming opening 40a1 formed in interlayer insulating film 40 as well as upper surface 30a of gate electrode 30 (see FIG. 5). Preferably, barrier layer 32c includes at least one of Ti and TiN.

Next, a gate pad forming step (S80, FIG. 15) is performed. Gate pad 33 is formed in contact with gate interconnection 32 through the opening formed in interlayer insulating film 41 (see FIG. 6). Gate pad 33 is made of a material including AlSiCu, for example.

Figure 26:
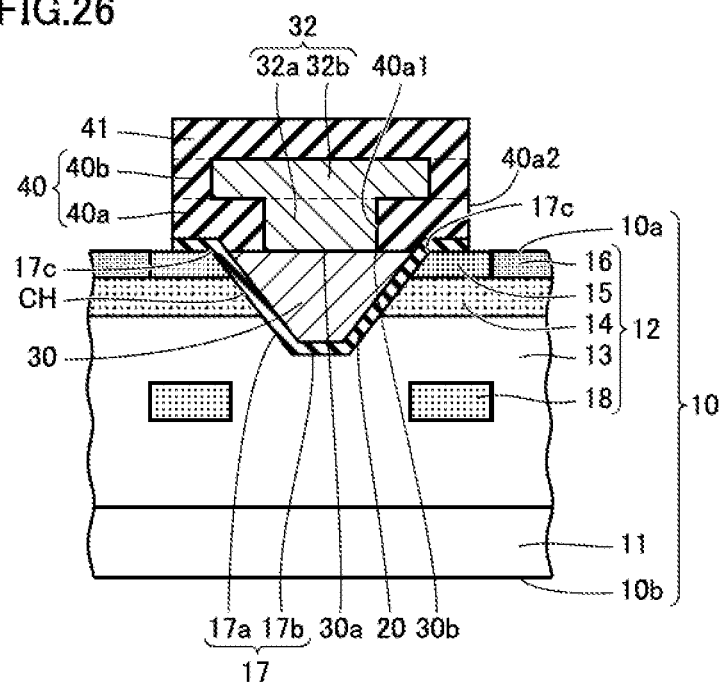
FIG. 26 is a partial schematic cross sectional view schematically showing a tenth step of the method for manufacturing the silicon carbide semiconductor device according to the embodiment of the present invention.

Next, a source electrode forming step is performed. With reference to FIG. 26, etching is performed to form opening 40a2 in interlayer insulating film 40 and gate insulating film 20. Through the opening, each of source region 15 and contact region 16 is exposed at first main surface 10a of silicon carbide substrate 10. Next, on first main surface 10a, source electrode 60 is formed in contact with each of source region 15 and contact region 16. Source electrode 60 is made of a material including Ti, Al, and Si, for example. Next, an alloying annealing is performed. Specifically, source electrode 60 in contact with each of source region 15 and contact region 16 is held for about 5 minutes at a temperature of not less than 900° C. and not more than 1100° C., for example. Accordingly, at least a portion of source electrode 60 reacts with silicon included in silicon carbide substrate 10, whereby it is silicided and alloyed. In this way, source electrode 60 in ohmic contact with source region 15 is formed. Next, drain electrode 70 is formed in contact with second main surface 10b of silicon carbide substrate 10. Next, lower pad electrode 80 is formed in contact with drain electrode 70. In this way, MOSFET 1 is obtained (FIG. 1).

Next, a modification of the gate insulating film forming step (S40: FIG. 15) will be described.

Figure 21:
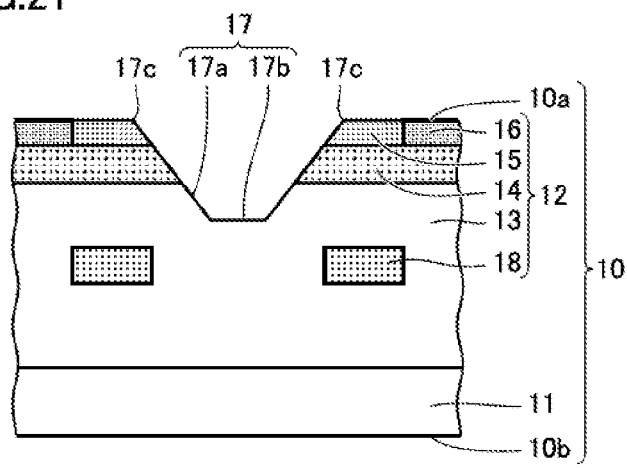
FIG. 21 is a partial schematic cross sectional view schematically showing a sixth step of the method for manufacturing the silicon carbide semiconductor device according to the embodiment of the present invention.

After forming silicon carbide substrate 10 having first main surface 10a in which trench 17 is formed as shown in FIG. 21, insulating film 43 is formed in contact with first main surface 10a of silicon carbide substrate 10 (see FIG. 27). Insulating film 43 is formed to extend from above corner portion 17c to above contact region 16 via above source region 15, for example. Insulating film 43 is a material including silicon dioxide, for example. Insulating film 43 may be a material including SiON, SiN, or the like. Preferable, insulating film 43 is formed by the chemical vapor deposition method.

With reference to FIG. 28, silicon carbide substrate 10 having first main surface 10a in which trench 17 is formed is thermally oxidized. Specifically, side portion 17a and bottom portion 17b of trench 17 are thermally oxidized with insulating film 43 being formed on first main surface 10a. In other words, insulating film 43 and side portion 17a and bottom portion 17b of trench 17 are oxidized simultaneously. In this way, gate insulating film 20 is formed in contact with insulating film 43 as well as each of side portion 17a and bottom portion 17b of trench 17.

Figure 29:
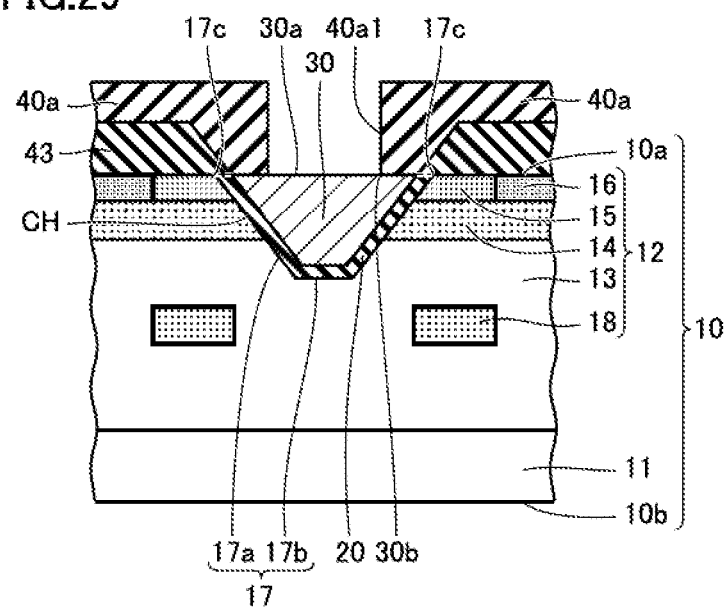
FIG. 29 is a partial schematic cross sectional view schematically showing a third step of the modification of the method for manufacturing the silicon carbide semiconductor device according to the embodiment of the present invention.

With reference to FIG. 29, gate electrode 30 is formed in contact with gate insulating film 20 within trench 17. Next, interlayer insulating film 40a is formed in contact with the outer circumferential region of upper surface 30a of gate electrode 30 and insulating film 43. Interlayer insulating film 40a is formed to extend from above source region 15 to abode gate electrode 30 so as to cover corner portion 17c. In other words, opening 40a1 is formed in interlayer insulating film 40a to expose the central region of upper surface 30a of gate electrode 30.

Although the MOSFET has been illustrated as an example of the silicon carbide semiconductor device in the present embodiment, the silicon carbide semiconductor device may be an IGBT (Insulated Gate Bipolar Transistor). Moreover, in the present embodiment, it has been illustrated that n type corresponds to the first conductivity type and p type corresponds to the second conductivity type, but p type may correspond to the first conductivity type and n type may correspond to the second conductivity type.

The following describes function and effect of MOSFET 1 serving as the silicon carbide semiconductor device according to the present embodiment.

In accordance with MOSFET 1 according to the present embodiment, when viewed in a cross section, interlayer insulating film 40a extends from above source region 15 to above gate electrode 30 so as to cover corner portion 17c. This leads to effective suppression of breakdown of gate insulating film 20 and interlayer insulating film 40a on corner portion 17c. As a result, the dielectric breakdown resistance of MOSFET 1 can be improved.

Further, in accordance with MOSFET 1 according to the present embodiment, gate interconnection 32 is made of a material having a melting point of not less than 1000° C. Accordingly, for example, even when gate interconnection 32 is heated to not less than 1000° C. in the alloying annealing step, gate interconnection 32 can be suppressed from being melted.

Further, in accordance with MOSFET 1 according to the present embodiment, the material includes at least one material selected from a group consisting of W, Ni, WSi, and polysilicon. Accordingly, gate interconnection 32 can be effectively suppressed from being melted.

Further, in accordance with MOSFET 1 according to the present embodiment, interlayer insulating film 40a has a carbon concentration smaller than a carbon concentration of gate insulating film 20. Accordingly, the insulating property of the insulating film is improved and leakage current can be reduced.

Further, MOSFET 1 according to the present embodiment includes barrier layer 32c in contact with each of gate interconnection 32, gate electrode 30, and interlayer insulating film 40a. Accordingly, the insulation performance of MOSFET 1 can be suppressed from being deteriorated by aluminum being diffused in interlayer insulating film 40a.

Further, in accordance with MOSFET 1 according to the present embodiment, barrier layer 32c includes at least one of Ti and TiN. Accordingly, adhesion can be improved between interlayer insulating film 40a and gate interconnection 32.

MOSFET 1 according to the present embodiment further includes gate pad 33 in contact with gate interconnection 32. Accordingly, voltage can be effectively applied to gate interconnection 32.

Further, in accordance with MOSFET 1 according to the present embodiment, side portion 17a of the trench includes first plane S1 having a plane orientation of {0-33-8}. Accordingly, channel resistance in side portion 17a can be reduced, thereby reducing on-resistance.

Further, in accordance with MOSFET 1 according to the present embodiment, side portion 17a of the trench microscopically includes first plane S1, and side portion 17a microscopically further includes second plane S2 having a plane orientation of {0-11-1}. Accordingly, channel resistance in side portion 17a can be further reduced, thereby reducing on-resistance.

Further, in accordance with MOSFET 1 according to the present embodiment, first plane S1 and second plane S2 of side portion 17a of the trench include a combined plane SR having a plane orientation of {0-11-2}. Accordingly, channel resistance in side portion 17a can be further reduced, thereby reducing on-resistance.

Further, in accordance with MOSFET 1 according to the present embodiment, side portion 17a of the trench macroscopically has an off angle of 62°±10° relative to a {000-1} plane. Accordingly, channel resistance in side portion 17a can be further reduced, thereby reducing on-resistance.

In accordance with the method for manufacturing MOSFET 1 according to the present embodiment, when viewed in a cross section, interlayer insulating film 40a extends from above source region 15 to above gate electrode 30 so as to cover corner portion 17c. This leads to effective suppression of breakdown of gate insulating film 20 and interlayer insulating film 40a on corner portion 17c. As a result, the dielectric breakdown resistance of MOSFET 1 can be improved.

Further, in accordance with the method for manufacturing MOSFET 1 according to the present embodiment, gate insulating film 20 is formed by thermally oxidizing silicon carbide substrate 10 in which trench 17 is formed. In this way, gate insulating film 20 having excellent insulation performance can be formed.

Further, in accordance with the method for manufacturing MOSFET 1 according to the present embodiment, interlayer insulating film 40 is formed by a chemical vapor deposition method. Accordingly, as compared with a case where the insulating film is formed by thermal oxidation, thick interlayer insulating film 40 can be grown for a shorter period of time.

Further, the method for manufacturing MOSFET 1 according to the present embodiment further includes the step of forming insulating film 43 in contact with main surface 10*a* of silicon carbide substrate 10 in which trench 17 is formed. In the step of forming gate insulating film 20, side portion 17*a* and bottom portion 17*b* of trench 17 is thermally oxidized with insulating film 43 being formed on main surface 10*a*. Accordingly, the thickness of the insulating film on corner portion 17*c* is increased, thereby improving the dielectric breakdown resistance of MOSFET 1.

Further, in accordance with the method for manufacturing MOSFET 1 according to the present embodiment, the step of forming gate interconnection 32 includes the step of forming barrier layer 32*c* in contact with each of gate electrode 30 and interlayer insulating film 40. Accordingly, the insulation performance of MOSFET 1 can be suppressed from being deteriorated by aluminum being diffused in interlayer insulating film 40*a*.

Further, in accordance with the method for manufacturing MOSFET 1 according to the present embodiment, barrier layer 32*c* includes at least one of Ti and TiN. Accordingly, adhesion can be improved between interlayer insulating film 40*a* and gate interconnection 32.

The method for manufacturing MOSFET 1 according to the present embodiment further includes the step of forming gate pad 33 in contact with gate interconnection 32. Accordingly, voltage can be effectively applied to gate interconnection 32.

Further, in accordance with the method for manufacturing MOSFET 1 according to the present embodiment, side portion 17*a* of trench 17 includes first plane S1 having a plane orientation of {0-33-8}. Accordingly, channel resistance in side portion 17*a* can be reduced, thereby reducing on-resistance.

Further, in accordance with the method for manufacturing MOSFET 1 according to the present embodiment, side portion 17*a* of trench 17 microscopically includes first plane S1, and side portion 17*a* microscopically further includes second plane S2 having a plane orientation of {0-11-1}. Accordingly, channel resistance in side portion 17*a* can be further reduced, thereby reducing on-resistance.

Further, in accordance with the method for manufacturing MOSFET 1 according to the present embodiment, first plane S1 and second plane S2 of side portion 17*a* of trench 17 include combined plane SR having a plane orientation of {0-11-2}. Accordingly, channel resistance in side portion 17*a* can be further reduced, thereby reducing on-resistance.

Further, in accordance with the method for manufacturing MOSFET 1 according to the present embodiment, side portion 17*a* of trench 17 macroscopically has an off angle of 62°±10° relative to a {000-1} plane. Accordingly, channel resistance in side portion 17*a* can be further reduced, thereby reducing on-resistance.

Although the present invention has been described and illustrated in detail, it is clearly understood that the same is by way of illustration and example only and is not to be taken by way of limitation, the scope of the present invention being interpreted by the terms of the appended claims.

What is claimed:

1. A silicon carbide semiconductor device comprising a silicon carbide substrate having a main surface,
    said silicon carbide substrate including
        a first impurity region that has a first conductivity type,
        a second impurity region that is provided on said first impurity region and that has a second conductivity type different from said first conductivity type,
        a third impurity region that is provided on said second impurity region so as to be separated from said first impurity region, said third impurity region having a surface that coincides with said main surface and having said first conductivity type, and
        a contact region that is provided on said second impurity region and in contact with said third impurity region,
    said main surface of said silicon carbide substrate being provided with a plurality of trenches,
    when viewed in a plan view, said plurality of trenches surround said contact region,
    a trench of said plurality of trenches having a side portion and a bottom portion, said side portion extending to said first impurity region through said third impurity region and said second impurity region, said bottom portion being located in said first impurity region,
    the silicon carbide semiconductor device further comprising:
        a gate insulating film in contact with said bottom portion, said side portion, and a corner portion formed by said side portion and said main surface;
        a gate electrode in contact with said gate insulating film within said trench;
        an interlayer insulating film that includes:
            a first interlayer insulating film in which a first opening having a first width is formed to expose a portion of said gate electrode, and
            a second interlayer insulating film on said first interlayer insulating film, a second opening having a second width being formed in said second interlayer insulating film, said second width being larger than said first width of said first opening; and
        a gate interconnection disposed in said first opening and in contact with said gate electrode,
    when viewed in a cross section, said interlayer insulating film extending from above said third impurity region to above said gate electrode so as to cover said corner portion,
    wherein said first width of said first opening is smaller than a width of an upper surface of said gate electrode, and
    wherein said second width of said second opening is larger than said width of said upper surface of said gate electrode.

2. The silicon carbide semiconductor device according to claim 1, wherein said gate interconnection is made of a material having a melting point of not less than 1000° C.

3. The silicon carbide semiconductor device according to claim 2, wherein said material includes at least one material selected from a group consisting of W, Ni, WSi, and polysilicon.

4. The silicon carbide semiconductor device according to claim 1, wherein said interlayer insulating film has a carbon concentration smaller than a carbon concentration of said gate insulating film.

5. The silicon carbide semiconductor device according to claim 1, wherein said gate interconnection includes a barrier layer in contact with each of said gate electrode and said interlayer insulating film.

6. The silicon carbide semiconductor device according to claim 5, wherein said barrier layer includes at least one of Ti and TiN.

7. The silicon carbide semiconductor device according to claim 1, further comprising a gate pad in contact with said gate interconnection.

8. The silicon carbide semiconductor device according to claim 1, wherein said side portion of said trench includes a first plane having a plane orientation of {0-33-8}.

9. The silicon carbide semiconductor device according to claim 8, wherein said side portion of said trench microscopically includes said first plane, and said side portion microscopically further includes a second plane having a plane orientation of {0-11-1}.

10. The silicon carbide semiconductor device according to claim 9, wherein said first plane and said second plane of said side portion of said trench include a combined plane having a plane orientation of {0-11-2}.

11. The silicon carbide semiconductor device according to claim 10, wherein said side portion of said trench macroscopically has an off angle of 62°±10° relative to a {000-1} plane.

* * * * *